United States Patent
Babic et al.

(10) Patent No.: US 6,208,007 B1
(45) Date of Patent: *Mar. 27, 2001

(54) BURIED LAYER IN A SEMICONDUCTOR FORMED BY BONDING

(75) Inventors: Dubravko Ivan Babic, Sunnyvale; John E. Bowers, Santa Barbara, both of CA (US)

(73) Assignee: The Regents of the University of California, Oakland, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/362,538

(22) Filed: Jul. 28, 1999

Related U.S. Application Data

(63) Continuation of application No. 08/612,687, filed on Mar. 8, 1996, now Pat. No. 5,977,604.

(51) Int. Cl.$^7$ .............................. H01L 31/00; H01L 29/06
(52) U.S. Cl. .................... 257/466; 257/618; 257/622; 257/623
(58) Field of Search .................................. 257/622, 466, 257/618, 623, 624

(56) References Cited

U.S. PATENT DOCUMENTS

| | | | |
|---|---|---|---|
| 4,638,552 | * 1/1987 | Shimbo et al. | 257/622 |
| 4,891,329 | 1/1990 | Reisman et al. | 438/459 |
| 4,948,748 | 8/1990 | Kitahara et al. | 438/405 |
| 5,286,671 | 2/1994 | Kurtz et al. | 438/456 |
| 5,346,848 | 9/1994 | Grupen-Shemansky et al. | 438/406 |
| 5,376,580 | 12/1994 | Kish et al. | 438/26 |
| 5,390,210 | 2/1995 | Fouquet | 372/92 |
| 5,393,711 | 2/1995 | Biallas et al. | 438/458 |
| 5,407,856 | 4/1995 | Quenzer et al. | 148/DIG. 12 |
| 5,413,951 | 5/1995 | Ohori et al. | 438/479 |
| 5,416,044 | 5/1995 | Chino et al. | 438/455 |
| 5,502,316 | 3/1996 | Kish et al. | 257/97 |
| 5,513,204 | 4/1996 | Jayaraman | 372/96 |
| 5,724,376 | 3/1998 | Kish, Jr. et al. | 372/96 |

FOREIGN PATENT DOCUMENTS

| | | |
|---|---|---|
| 90202366 | 6/1990 | (EP) . |
| 63-79312 | 4/1988 | (JP) . |
| 5-198529 | 8/1993 | (JP) . |

OTHER PUBLICATIONS

Dubravko Ivan Babic, Ph.D., "Double–fused Long–wavelength Vertical–cavity Lasers", Dissertation, ECE Technical Report #95–20, Aug. 1995, University of California at Santa Barbara, California 93106.

* cited by examiner

Primary Examiner—Minh Loan Tran
(74) Attorney, Agent, or Firm—Gates & Cooper

(57) ABSTRACT

Buried layers are formed within a semiconductor. Metallic or insulating buried layers are produced several microns within a semiconductor substrate. The buried layer can confine current to the buried layer itself by using a conductive material to create the buried layer. The buried layer can also confine current to a specified area of the semiconductor, by using an insulating material inside of the buried layer or by leaving a created void within the material. The buried layer is useful in the construction of a semiconductor Vertical Cavity Laser (VCL). A buried isolation layer confines the current to a narrow active region increasing efficiency of the VCL. The buried layer is also useful in fabricating discrete devices, such as diodes, transistors, and photodetectors, as well as fabricating integrated circuits.

10 Claims, 13 Drawing Sheets

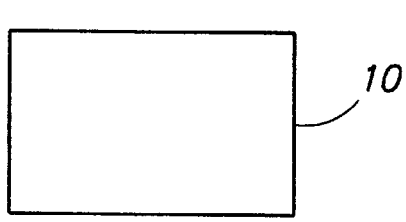
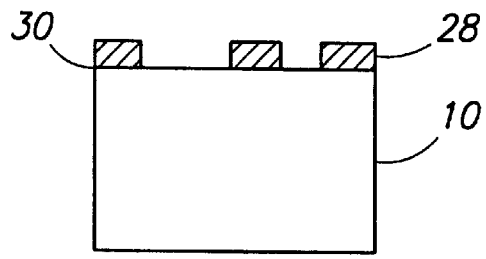
FIG. 2A
FIG. 2B
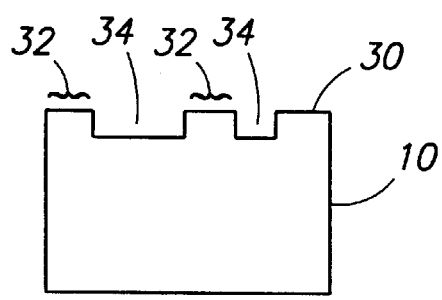
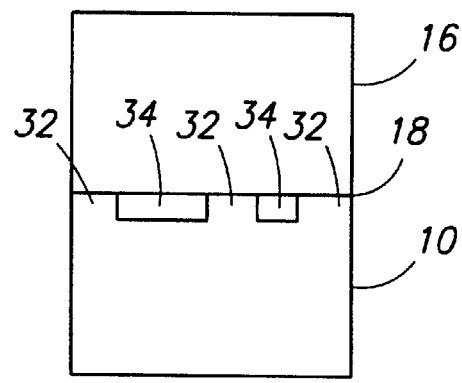
FIG. 2C
FIG. 2D
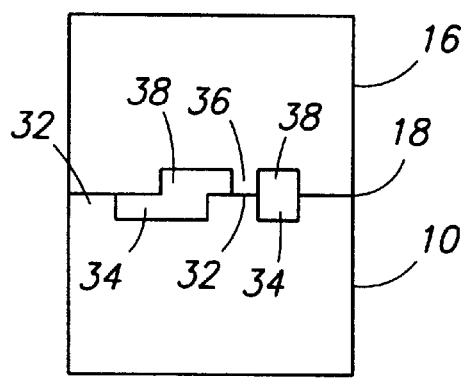
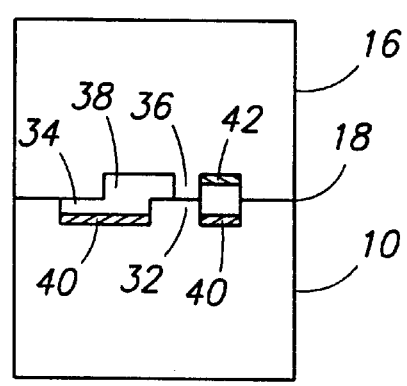
FIG. 2E
FIG. 2F

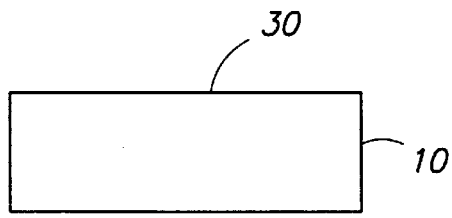
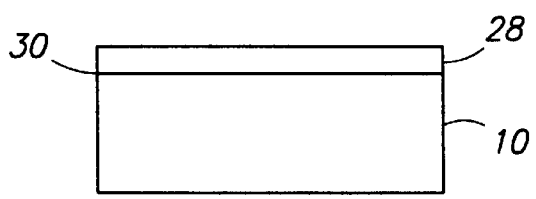
FIG. 9A    FIG. 9B
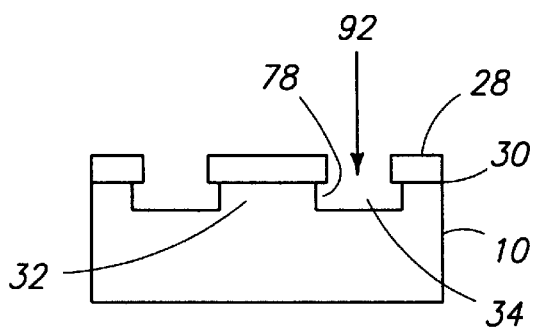
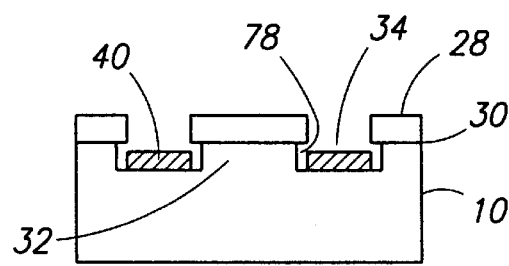
FIG. 9C    FIG. 9D
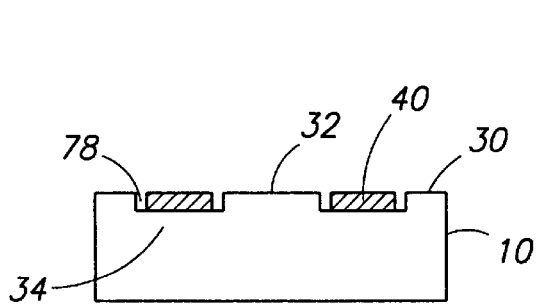
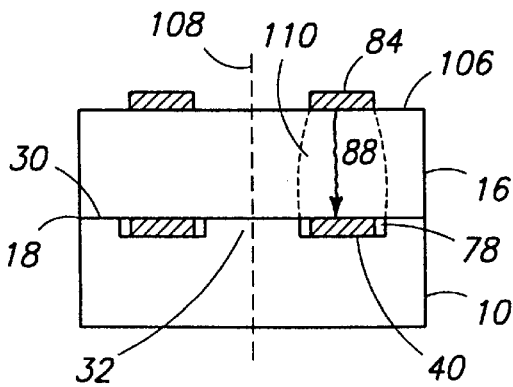
FIG. 9E    FIG. 9F

BURIED LAYER IN A SEMICONDUCTOR FORMED BY BONDING

"This application is a Continuation of application Ser. No. 08/612,687, filed on Mar. 8, 1996, U.S. Pat. No. 5,977,604 entitled "BURIED LAYER IN A SEMICONDUCTOR FORMED BY BONDING", which application is incorporated herein by reference."

STATEMENT AS TO RIGHTS TO INVENTIONS MADE UNDER FEDERALLY SPONSORED RESEARCH AND DEVELOPMENT

This invention was made with Government support under Grant No. F19628-95C-0054, awarded by the Air Force Office of Scientific Research. The Government has certain rights in this invention.

BACKGROUND OF THE INVENTION

1. Field of the Invention.

A semiconductor with a buried blocking or conducting layer is a valuable electronic or optoelectronic element.

This invention relates in general to creating buried layers within a semiconductor. More particularly, the invention is directed to creating metallic or insulating buried layers deep within a semiconductor substrate. The invention is further concerned with lasers formed using such a substrate.

2. Description of Related Art.

The optical fiber and the semiconductor laser have revolutionized the field of information transmission. The development of fiber optic communication systems has been fueled by the growing need for a high bit-rate and high volume communication medium that is more efficient than the coaxial cable. Optical fibers can guide information encoded in light signals uninterrupted over hundreds of kilometers, while the semiconductor laser provides an inexpensive source for such optical transmission.

Presently, optical fibers are being installed around the world: across the land and under the oceans. Both commercial telephone and business communications are being conducted over these links. Such links use a large number of semiconductor lasers to transmit and amplify the signals. Communication applications extend to numerous short distance applications, such as, local area networks, and chip-to-chip communication. Compact disc players and optical storage devices, as well as, laser printing were brought to mass production owing to the inexpensive semiconductor laser. Semiconductor lasers are pushing their way into many other fields where they are replacing large solid state or gas lasers with small devices barely visible to the naked eye.

In recent years, the vertical-cavity laser (VCL) has emerged as a new coherent light source alongside the conventional in-plane laser. This is due to its compactness, inherent single-longitudinal mode operation, circular beam profile and straightforward integration with other electronic circuitry. Vertical-cavity lasers hold promise of superior performance in many optoelectronic applications and lower manufacturing cost than in-plane lasers.

State of the art GaAs-based vertical-cavity lasers operate continuously at room-temperature with sub-100 $\mu$A threshold currents. The outstanding performance of these laser greatly relies on their monolithic fabrication process and the quality of Al(Ga)As/GaAs quarter-wave mirrors, which are presently the highest quality epitaxial mirrors that can be routinely fabricated.

The development of long-wavelength 1.3 $\mu$m and 1.55 $\mu$m vertical-cavity surface-emitting lasers has been driven by the need for low cost, high speed sources for optical communications and interconnects. However, the practical realization of these lasers has been a difficult process over the last decade due to numerous technological difficulties. A significant problem has been the fabrication of mirrors with sufficiently high reflectivity and adequate electrical and thermal properties. It has been recently demonstrated that, using the process of wafer fusion, InGaAsP active layers operating at 1.3 $\mu$m and 1.55 $\mu$m can be bonded to Al(Ga) As/GaAs mirrors, thereby enabling the fabrication of long-wavelength vertical-cavity lasers with mirrors grown on GaAs.

The methods for fabricating a VCL that have high reflectivity mirrors, proper current confinement to the active region of the VCL, and proper VCL structure have, to this point, been expensive and lengthy. The inability to grow GaAs, which is a preferred mirror material, on InP because of improper lattice matching creates problems for InP active layer VCLs. The low yields created by deeply etched well VCLs and the low reflectivity create efficiency and output problems. The use of amorphous silicon reduces the reflectivity of one of the mirrors, also reducing the efficiency and yields for these methods of constructing VCLs.

The creation of buried layers that can block current flow, or, conversely, channel current flow without appreciably affecting the semiconductor currents can be used in numerous semiconductor devices besides VCLs. VLSI devices also experience problems because of interference between layers of the device; buried layers formed via ion implantation are not deep enough into the semiconductor bulk to eliminate the effect on the conductive paths in a VLSI device. VLSI devices are combinations of transistors, diodes, resistors, and capacitors, and therefore, a buried blocking layer can be effective in enhancing the output characteristics of all types of semiconductor devices. Further, the use of buried insulating or conducting layers created via fusion can be used in place of or in conjunction with ion implantation or diffusion techniques to fabricate diodes, transistors, photodetectors, and other discrete and integrated semiconductor devices.

It can be seen then that there is a need for a method of creating a buried layer deep within a semiconductor device. It can also be seen that there is a need for a method of creating buried layers that are insulating in nature, thereby channeling current through certain regions of the semiconductor. There is also a need for a method of creating buried layers that carry current efficiently, thereby leaving the surrounding regions of the semiconductor unaffected.

SUMMARY OF THE INVENTION

To minimize the limitations described above, and other limitations that will become apparent upon reading and understanding the present specification, the present invention discloses a powerful device and method for creating a buried layer within a semiconductor device. The present invention is integrable with current fabrication techniques with both crystalline and amorphous substrates.

The present invention minimizes the above-described problems by providing a method for creating a doped region on the surface of a semiconductor wafer, and then by fusing or bonding that surface to another wafer, making that doped region a buried layer.

Further, by etching into the first wafer prior to fusing or bonding, a void may be created within a semiconductor device. The void will be completely surrounded with crystalline semiconductor material. The void may be partially or completely filled with material, either insulating or conductive, depending on the application desired.

A system in accordance with the principles of the present invention comprises creating a doped region within a wafer, where the doped region is exposed to one of the working planes of the wafer, and then fusing or bonding that surface to a second wafer, thus burying the doped region.

Similarly, if an etched area was created in the first wafer, and then the surface with the etched channel was fused to a second wafer, the void created by the etch would be sealed within the semiconductor bulk, having been covered by the second wafer.

One object of the present invention is to channel currents within a semiconductor device. Another object of the present invention is to channel currents within a conductive channel buried in a semiconductor device. Another object is to channel light within a semiconductor device.

These and various other advantages and features of the invention are pointed out with particularity in the claims and form a part hereof. A further understanding of the invention, its advantages, and the objects obtained by its use, is obtained from the following description and the drawings.

BRIEF DESCRIPTION OF THE DRAWINGS

Referring now to the drawings in which like reference numbers represent corresponding parts throughout:

FIGS. 2A–2F are cross sectional block diagrams of a mesa and valley method of performing the invention;

FIGS. 9A–9F are cross sectional views of a method for constructing a photodetector;

DETAILED DESCRIPTION OF THE INVENTION

The present invention provides a method of constructing a buried layer within a semiconductor device.

Figure 1A:
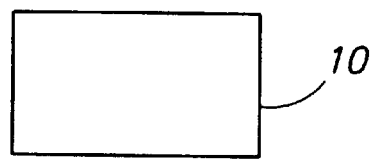
FIGS. 1A–1F are cross sectional block diagrams of a planar method of performing the invention.

FIG. 1A–1F are cross sectional block diagrams of a planar method of performing the invention. In FIG. 1A, a semiconductor wafer 10 is shown. The wafer 10 can be of a single crystalline element, such as silicon or germanium, or can be a compound, such as Gallium Arsenide (GaAs) or Indium Phosphide (InP). The wafer 10 is normally planar, but can also be piecewise linear. Piecewise linear surfaces are locally linear, but globally non-linear.

Figure 1B:
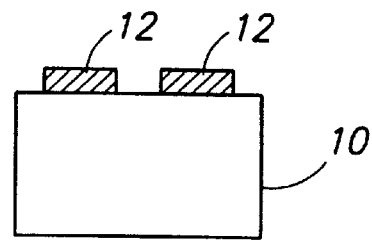

In FIG. 1B, wafer 10 initially has a dopant 12 deposited on the surface in a desired pattern to create a junction. The dopant can be of a conductive type, such as boron, phosphorous, or arsenic as used in silicon processing, or an insulating type, such as iron and oxygen as used in GaAs and InP processing, depending on the application desired for the device.

Figure 1C:
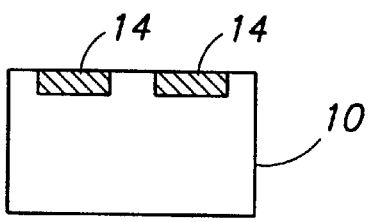

In FIG. 1C, the dopant 12 is then driven into the material to create a doped well 14 (also described as a region) within the wafer 10. The atoms on the surface of the wafer 10 replace the atoms within the crystalline structure upon application of heat to the wafer 10. Alternatively, FIGS. 1B and 1C can be performed by ion implantation of the dopant 12 into the wafer 10.

Figure 1D:
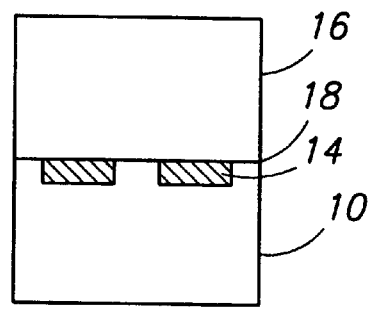

FIG. 1D shows the wafer 10 physically in contact with cover wafer 16. The cover wafer 16 can be a wafer of the same material as wafer 10, or can be of a different material than wafer 10. Once this physical connection is made, and the wafer 10 and the cover wafer 16 are properly aligned, heat is applied to the combination to fuse the wafer 10 and the cover wafer 16. The fusion process normally requires placing the wafers in an autoclave and raising the temperature to approximately 600 degrees Centigrade for InP and GaAs, but may be higher or lower for other materials. A typical fusion process is described in U.S. Pat. No. 5,407,856, which is incorporated by reference. The junction created by the physical connection between the wafer 10 and the cover wafer 16 is the fusion junction 18. The wells 14 now become a buried layer within the structure created by the wafer 10 and the cover wafer 16.

Figure 1E:
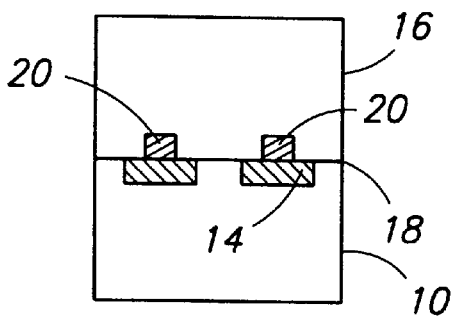

FIG. 1E is a different construction technique than FIG. 1D. Prior to the fusion step, dopant 12 may be introduced onto the cover wafer 16 to create cover wells 20. FIG. 1E shows that the cover wafer 16 may have dopant wells that may overlap the wells 14 in the wafer 10. Similarly, the cover wells 20 do not have to overlap the wells 14; the overlap is dependent on the design of the device and the requirements of the device. These cover wells 20 can be of the same dopant material as the wells 14, or can be of a different dopant material, thus allowing for insulating wells in the cover wafer 16 and conducting wells in the wafer 10, or wells of different types of conductor, or any combination desired by the designer or required by the device.

Figure 1F:
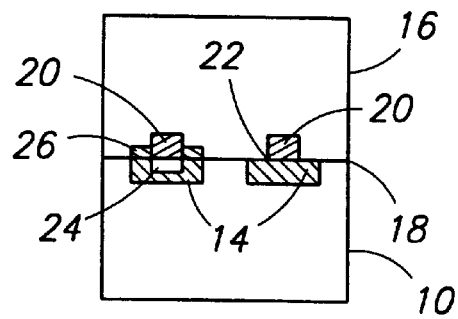

FIG. 1F is a further refinement of FIG. 1E. By properly choosing the dopant material, the substrate material, and the alignment of the wells 14 and the cover wells 20, diffusion can be designed into the fusion process across the fusion junction 18. Typical fabrication processes shown in FIGS. 1B and 1C are performed by heat. The fusion process also requires heat to fuse the wafer 10 and the cover wafer 16, and can be used for additional diffusion of the wells 14 and the cover wells 20. The well 14 and the cover well 20 can be designed to not diffuse across the fusion junction 18 in certain sections as shown at junction 22. The well 14 can also be designed, by using proper dopants and wafer 10 and cover wafer 16 materials, to diffuse across the fusion junction 18 during fusion. This process is called "fusion-diffusion," or "cross diffusion." The cross diffusion process creates a cross diffusion well 24 underneath the cover well 20 in the wafer 10. By designing the cover well 20 and well 14 depths properly, the depth of the cross diffusion well 24 can be determined prior to the fusion process to prevent the cross diffusion well 24 from diffusing completely through the well 14.

Similarly, a cover cross diffusion well 26 can be created in the cover wafer 16. The use of geometry and different dopant densities can create cover cross diffusion wells 26 that do not intrude into the cover well 20 as shown, or, if desired, do intrude into the cover well with the dopant used in the well 14.

The use of different dopant and wafer materials, geometries, and dopant depths creates various combinations of different charge carriers, insulating layers, and cross diffusion characteristics. These combinations are controlled by the designer.

FIGS. 2A–2F are cross sectional block diagrams of a mesa and valley method of performing the invention. FIG. 2A shows the wafer 10 prior to processing. FIG. 2B shows the wafer 10 patterned by a pattern material 28. Typically, the pattern material 28 is photoresist, but the pattern material 28 can be anything which alternatively exposes and covers the top surface 30 of the wafer 10. The wafer 10 is then etched with an etchant. Alternatively, the wafer 10 can have material grown on the top surface 30 of the wafer 10, where material is grown to match the pattern created by the pattern material 28. The material grown may be amorphous or crystalline. Typically, the wafer 10 is etched in a wet chemical etchant, but the wafer 10 can be etched or processed by any other means.

FIG. 2C shows the wafer 10 etched and the pattern material 28 removed. The etching will leave mesas 32 and valleys 34. The valleys 34 are exposed areas of the wafer 10 which are lower in height than the original top surface 30 of the wafer 10. The mesas 32 are areas which still extend to the original top surface 30 of the wafer 10.

FIG. 2D shows the wafer 10 physically in contact with cover wafer 16. The cover wafer 16 can be a wafer of the same material as wafer 10, or can be of a different material than wafer 10. Once this physical connection is made, and the wafer 10 and the cover wafer 16 are properly aligned, heat is applied to the combination to fuse the wafer 10 and the cover wafer 16. The junction created by the physical connection between the wafer 10 and the cover wafer 16 is the fusion junction 18. The fusion process typically does not appreciably change the shape of the valley 34 by more than a few percent, depending on the valley 34 dimensions, wafer materials, and fusion times. The valleys 34 now become a buried void within the structure created by the wafer 10 and the cover wafer 16. This void can be buried several microns deep in a semiconductor structure. Since there are no charge carriers in the void, any current travelling between wafer 10 and cover wafer 16 must travel through the mesas 32. The use of the valleys 34 to create cavities increases the current density in the mesas 32.

FIG. 2E is a further refinement of FIG. 2D. Prior to FIG. 2D, cover wafer 16 is also patterned and etched as illustrated in FIGS. 2B and 2C. This now creates cover mesas 36 and cover valleys 38 on cover wafer 16. When the wafer 10 and the cover wafer 16 are properly aligned, this creates more geometric patterns than are possible if only the wafer 10 is etched. Larger voids created by overlapping the cover valley 38 and the valley 34 would be possible depending on the alignment and design of the device. Additionally, mesa 32 may be completely surrounded or enclosed by cover valley 38, or cover mesa 36 may be completely surrounded or enclosed by valley 34. This would allow the top of cover mesa 36 to extend into valley 34, and possibly touch the bottom surface of valley 34.

FIG. 2F is a further refinement of FIGS. 2D and 2E. At times, a design may require even more current confinement than an empty valley 34 and cover valley 38 can supply. Alternatively, a design may require current to be carried in the valley 34, without affecting the current in the mesa 32, or current to be carried in the cover valley 38 without affecting the current in the valley 34.

By depositing valley material 40, additional current confinement is possible if insulating material is used for the valley material 40. The valley material 40 may be solid, liquid, or gaseous, or the valley 34 can be partially or fully evacuated by performing the fusing or bonding step in a vacuum. Alternatively, current flow in the valley 34 is possible if conductive material is deposited in the valley 34. This is possible only when the height of the valley material 40 is less than or equal to the height of the mesa 32. The valley material 40 may be less than or equal to the height of the mesa 32, less than or equal to the width of the valley 34, or any combination thereof. The deposition of the valley material 40 may also be offset in the valley 34, such that the valley material 40 is closer to the wall of the mesa 32 at one end of the valley 34 than the valley material 40 is to the wall of the mesa 32 at the other end of the valley 34. Further, the valley material 40 may, for some applications, be deposited at a level higher than the mesa 32, or on top of the mesa 32. Similarly, depositing cover valley material 42 in the cover valley 38 allows for additional current confinement or additional current carrying capabilities in the cover valley 38, depending on the type of material used for the cover valley material 42. Valley material 40 and cover valley material 42 may be metals, such as nickel or tin, and may be deposited on an insulating layer as well as directly on the semiconductor surface.

Figure 3A:
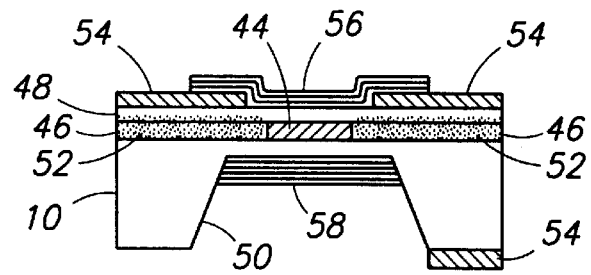
FIGS. 3A–3C are cross sectional diagrams showing methods of constructing a Vertical Cavity Laser (VCL)
Figure 3B:
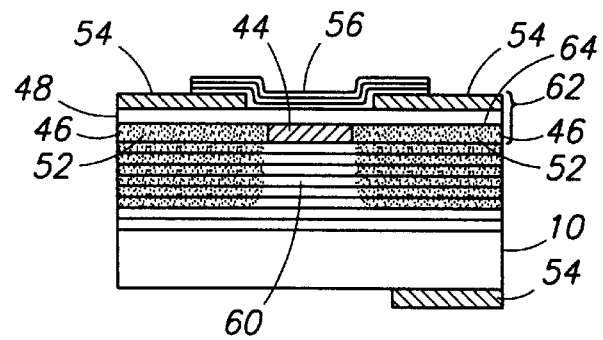
Figure 3C:
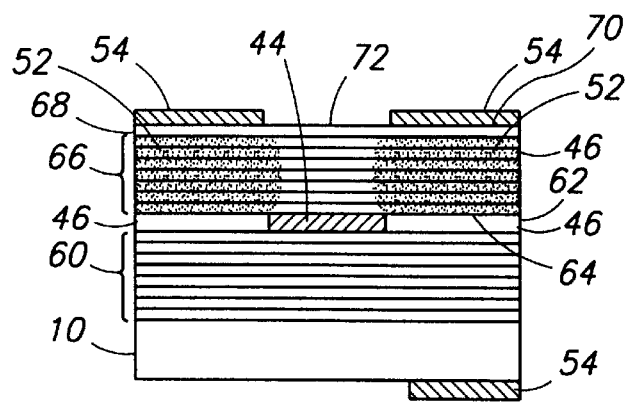

FIGS. 3A–3C are cross sectional diagrams showing methods of constructing a Vertical Cavity Laser (VCL). In FIG. 3A, illustrative of the prior art, the wafer 10 is first grown with an active region 44, non-active regions 46, and cladding layer 48. The active region 44 may be an active, absorbing, or modulating region, depending on the desired device. The wafer 10 is then thinned in thinning region 50, and a well is formed. If necessary, additional current confinement regions 52 can be added to the non-active regions 46 to force the current to pass through the active region 44 by etching, implantation, or regrowth. Contacts 54 are then added to the wafer 10.

Finally, a top Distributed Bragg Reflector (DBR) 56 and a bottom DBR 58 are added. The top DBR 56 and the bottom DBR 58 are both amorphous dielectric mirrors to allow the energy to reflect through the active region 44. Amorphous mirrors are deposited by low-temperature deposition techniques, such as evaporation, sputtering, or plasma enhanced chemical vapor deposition (PECVD), and are generally insulating. This method produces low-efficiency VCLs because the amorphous nature of the top DBR 56 and the bottom DBR 58 make them poor reflectors, thus giving the lasers typically higher thermal resistance and increasing the current density in the active region 44.

FIG. 3B shows a VCL which has one conductive DBR grown epitaxially, and one amorphous DBR. The wafer 10 first has an epitaxial DBR 60 grown on the surface of the wafer 10. Epitaxial DBRs 60 have reflectivities up to 99.9% versus ≦99% for amorphous DBRs, and therefore allow for more energy to be reflected back to the active region 44 because the laser has a better resonator. An active region 44 and non-active regions 46 are epitaxially grown on a second wafer 62, and the second wafer 62 is fused to the wafer 10 on top of the epitaxial DBR 60. The entire second wafer 62 is then thinned to thinning junction 64. Thinning junction 64 can be defined by an etchstop layer in the second wafer 62, or other means. Once the second wafer 62 is thinned to the thinning junction 64, current confinement regions 52 can be added to increase the current density in the active region 44. Contacts 54 are added to the second wafer 62 on top of the thinning junction 64, and to the bottom of wafer 10.

Finally, a top Distributed Bragg Reflector (DBR) 56 is added. This method of construction allows for better reflection by one of the mirrors, but is still limited by the lower reflectivity of the top DBR 56.

FIG. 3C shows a structure with two epitaxial DBRs. This structure has the advantage of having high reflectivity on both sides of the active region 44, allowing for current gain through the active region 44. The wafer 10 first has an epitaxial DBR 60 grown on the surface of the wafer 10. Epitaxial DBRs 60 have higher electrical and thermal reflectivities and therefore allow for more energy to pass through the active region 44. An active region 44 and non-active regions 46 are epitaxially grown on a second wafer 62, and the second wafer 62 is fused to the wafer 10 on top of the epitaxial DBR 60. The entire second wafer 62 is then thinned to thinning junction 64. Thinning junction 64 can be defined by an etchstop layer in the second wafer 62, or other means.

A top epitaxial DBR 66 is then grown on a third wafer 68. If necessary, current confinement regions 52 can be implanted or diffused into the top epitaxial DBR 66 to provide current confinement. The top epitaxial DBR 66 is then fused to the active region 44 and non-active regions 46 at the thinning junction 64. The third wafer 68 is then thinned to a second thinning junction 70. Contacts 54 are then added to the third wafer 68 at the second thinning junction 70, and to the wafer 10. The opening 72 allows the laser light to escape from the VCL. Contacts 54 can be added at different locations, and the laser light can escape from the top of the VCL. Alternatively, light can be emitted through the wafer 10 substrate.

Figure 4:
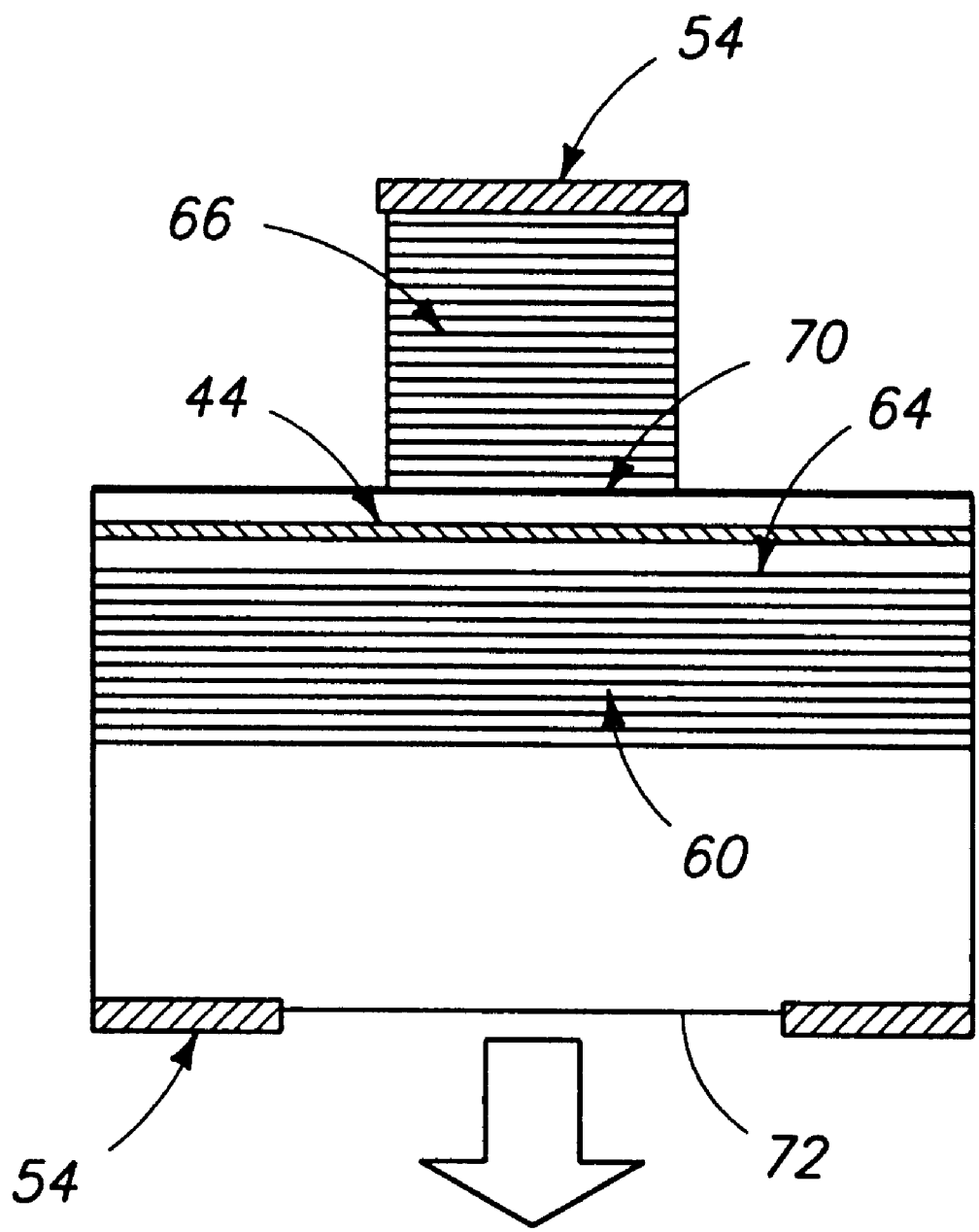
FIG. 4 is a cross sectional view of a completed VCL.

FIG. 4 is a cross sectional view of a completed VCL. The structure of the top epitaxial DBR 66 is smaller in width than the epitaxial DBR 60, allowing for natural current confinement within the area below the top epitaxial DBR 66. The laser light is emitted from the VCL through opening 72.

Figure 5A:
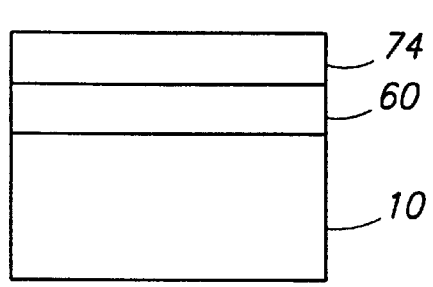
FIGS. 5A–5K are cross sectional views of the use of patterned bonding as a means for current confinement.

FIGS. 5A–5K are cross sectional views of the use of patterned bonding as means for current confinement. In FIG. 5A, wafer 10 has an epitaxial DBR 60 grown on top of the wafer 10 surface. The wafer 10 is preferably Gallium Arsenide (GaAs), but can be other materials. The epitaxial DBR 60 is usually a p-type DBR, but if other materials are used for the wafer 10, the epitaxial DBR can be an n-type DBR. If wafer 10 is GaAs, the epitaxial DBR 60 is preferably AlAs/GaAs layers or AlGaAs/GaAs layers. A cladding layer 74 is then epitaxially grown on top of the epitaxial DBR 60, which ended with a GaAs layer. This cladding layer 74 is preferably InP, but can be other materials.

Figure 5B:
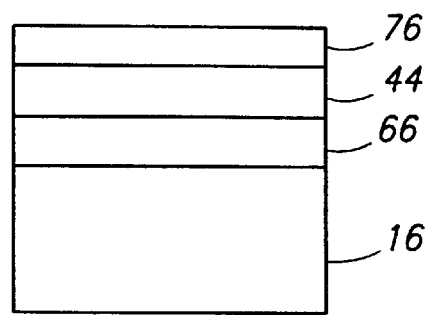

Similarly, in FIG. 5B, the cover wafer 16 has a top epitaxial DBR 66 grown on top of the cover wafer 16. The cover wafer is preferably Indium Phosphide (InP), but can be other materials. The top epitaxial DBR 66 is preferably of the opposite carrier type than that of the epitaxial DBR 60. If so, the layers of the top epitaxial DBR 66 are InGaAsP/InP. An active layer 44 is then grown on top of the top epitaxial DBR 66. The active layer 44 can be either a quantum well or bulk layer. Finally, a second cladding layer 76 is epitaxially grown on top of the active layer 44. The second cladding layer 76 is typically InP, but if the second wafer 16 or if the wafer 10 is a different material than preferred, the second cladding layer 76 can be a different material as well.

Figure 5C:
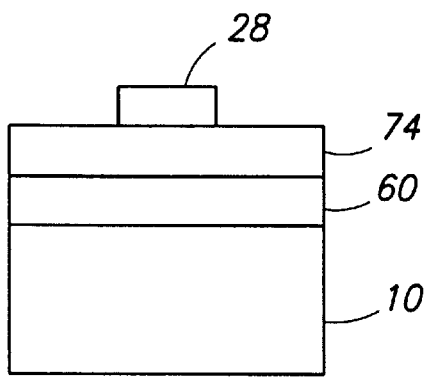

In FIG. 5C, one of the wafers is patterned. Either wafer can be patterned via etching; for illustration, the wafer 10 is shown as patterned. First, pattern material 28 is placed on top of the cladding layer 74. The pattern material 28 is usually photoresist that has been masked and exposed to ultraviolet light.

Figure 5D:
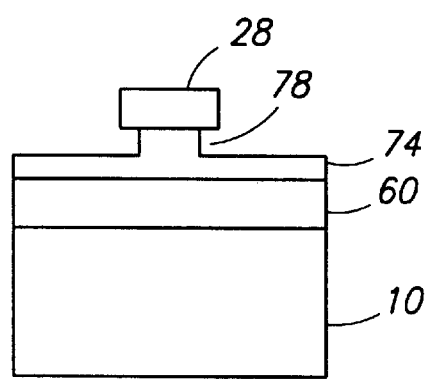

In FIG. 5D, once the pattern material 28 is exposed, the cladding layer 74 is etched via either reactive ion etching (RIE) or wet chemical etching or other means to purposely undercut the pattern material 28 as shown by undercut area 78.

Figure 5E:
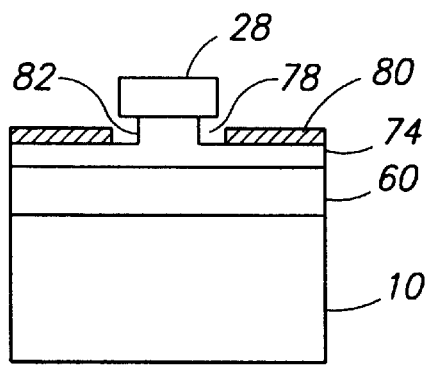
Figure 5F:
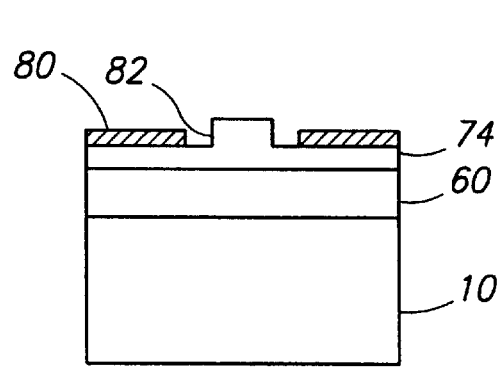

In FIG. 5E, an isolating layer 80 is evaporated onto the cladding layer 74. The undercut area 78 is not covered by the isolating layer 80. The isolating layer is preferably $SiO_2$, but can be any insulating material that does not allow current to pass through it easily. The thickness of the isolating layer 80 must be less than the height of the etch mesa 82 in the cladding layer 74. This is the critical step in the construction process, as will be explained later. FIG. 5F shows the resulting structure after the pattern material 28 has been removed.

Figure 5G:
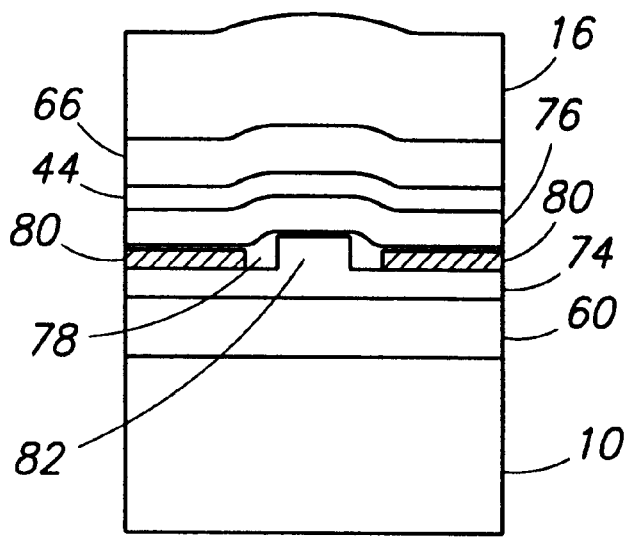

FIG. 5G shows wafer 10 and cover wafer 16 fused together. The wafers are fused with the second cladding layer 76 in contact with the cladding layer 74 and the isolating layer 80. The cover wafer 16 may bow slightly during the fusion process because the height of the etch mesa 82 is higher than the isolating layer 80. The criticality of the height of the isolating layer 80 with respect to the height of the etch mesa 82 comes into play because if the epitaxially grown layers of the cover wafer 16 have to bow too much to fuse to the etch mesa 82 and the isolating layer 80, there will be overstress in the second cladding layer 76, reducing device yield and device efficiency. In some cases, a void above isolating layer 80 may remain.

Figure 5H:
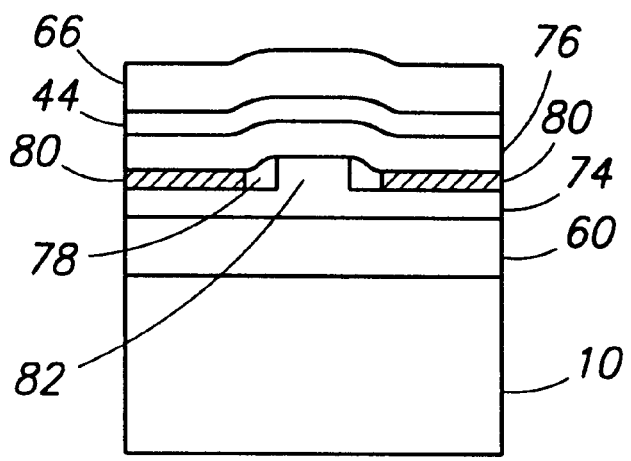

FIG. 5H shows wafer 10 and the remaining fused portions of the structure, after cover wafer 16 has been removed via etching. The relatively thin top epitaxial DBR 66, active layer 44, and second cladding layer 76 will reveal the location of the etch mesas 82 on the wafer 10. If the etch mesas are still not visible, an alternative method would be to use an infrared aligner. Another alternative method would be to make either wafer 10 larger than cover wafer 16, or cover wafer 16 larger than wafer 10. The location of the etch mesas 82 would be known because some of the etch mesas 82 would not be covered with the cover wafer 16. If the cover wafer 16 is to be made larger than wafer 10, then the patterns and etch mesas 82 should be placed in the cover wafer 16, and not in the wafer 10 as described above. The steps and processes for this are the same as described herein.

Figure 5I:
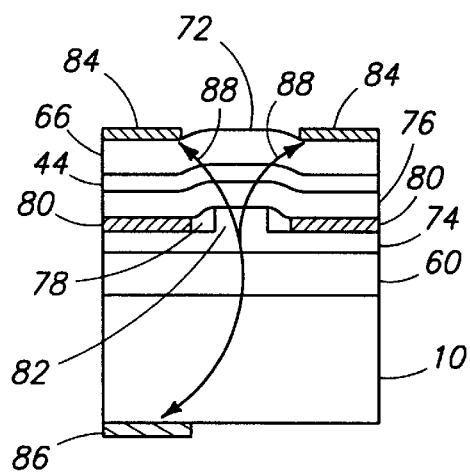

FIG. 5I shows contacts 84 deposited on top of the top epitaxial DBR 66 and wafer contact 86 deposited on the wafer 10. The current flow between contacts 84 and wafer contact 86 is shown by arrows 88. The current is confined to flow through the etch mesa 82 and is constricted by the isolating layer 80 and the undercut area 78. The opening 72 can be used as the laser output of the device.

Figure 5J:
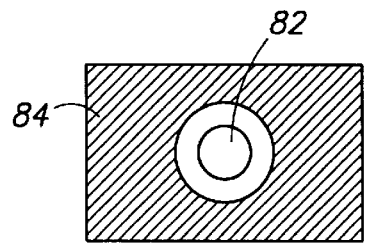

FIG. 5J shows a top view of the structure, showing that the etch mesa 82 diameter is smaller than the opening 72 defined by the contact 84.

Figure 5K:
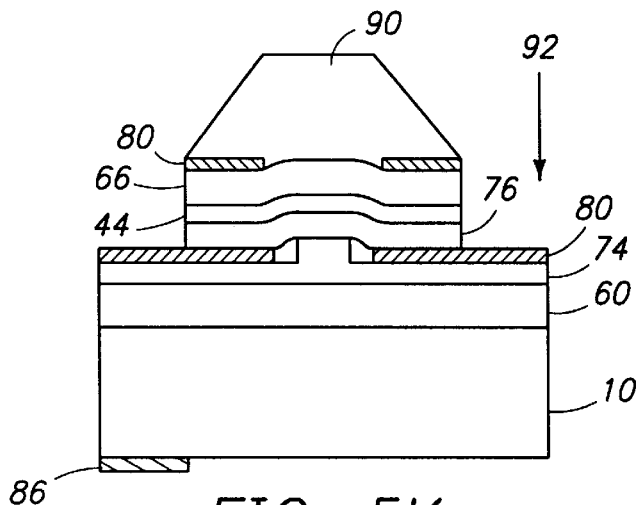

FIG. 5K shows the final processing step. A protective cover 90 may be added to the top of the isolating layer 80 and the top epitaxial DBR 66. This protective cover 90 can be an additional DBR, depending on the efficiency of the epitaxial DBR 60 and the top epitaxial DBR 66, or it can be a protective cover for the opening 72. If the protective cover 90 is a DBR, it is preferably made of $Si/SiO_2$ or $TiO_2/SiO_2$, to further enhance the reflectivity of the top epitaxial DBR 66, but can be made of other materials. Regardless of whether the opening is covered with a DBR or not, the protective cover 90 must be a material which will be able to withstand RIE or other etching means. RIE 92 is then performed on the wafer, and the protective cover 90 protects the contact 80, top epitaxial DBR 66, active layer 44, and second cladding layer 76 from the RIE. The etching process, in this case RIE 92, is stopped at the isolating layer 80. This isolates the device from the remainder of the devices on the wafer 10. Depending on whether the protective cover 90 is a DBR or just a protection material, it can be removed for final device construction.

Figure 6A:
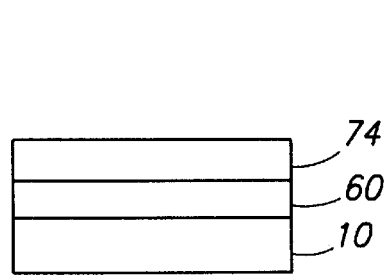
FIGS. 6A–6F are cross sectional views of a second method for constructing a VCL.

FIGS. 6A–6F are cross sectional views of a second method for constructing a VCL. In FIG. 6A, an epitaxial DBR 60 is grown on wafer 10. As before, wafer 10 is usually GaAs and the epitaxial DBR 60 is usually alternating layers of AlAs/GaAs. A cladding layer 74 is epitaxially grown on the epitaxial DBR 60. Cladding layer 74 is the last GaAs layer of the epitaxial DBR 60, and the cladding layer 74 may be thicker than a quarter wave layer of the epitaxial DBR 60.

Figure 6B:
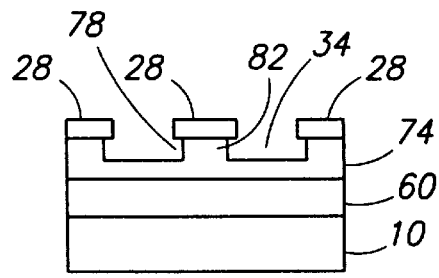

In FIG. 6B, a pattern material 28 is deposited on the top surface of the cladding layer 74. The pattern material 28 is typically photoresist. The pattern material is then alternatively hardened and removed to leave the desired pattern in the pattern material 28. This step alternatively exposes and covers the cladding layer 74. The surface with the pattern material 28 is then exposed to an etchant, either wet chemical etching or RIE or other dry etching means. This will etch valleys 34 into the cladding layer 74, and where the pattern material 28 covers the cladding layer 74, the cladding layer 74 will have etch mesas 82. There is typically some undercutting of the pattern material 28, leaving undercut areas 78.

Figure 6C:
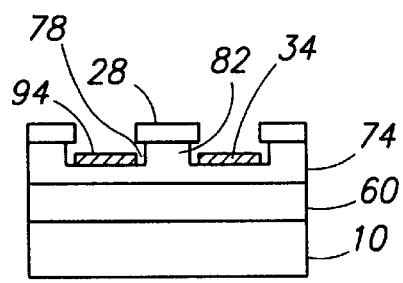

FIG. 6C shows using the pattern material 28 as a self-aligning mask and evaporating metal contacts 94 into the valleys 34. The pattern material 28 prevents evaporation of the metal contacts in the undercut areas 78. The height of the metal contacts 94 must be less than the height of the etch mesa 82.

Figure 6D:
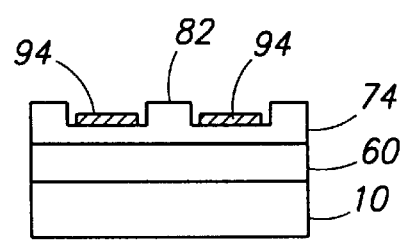

FIG. 6D shows the pattern material 28 removed, leaving the top surface of cladding layer 74 ready for fusion to another wafer. The metal contacts 94 will become buried layers after the fusion process. For low temperature fusing, the metal contacts 94 can be Nickel, Titanium, or Gold; for higher temperature fusion processes, refractory metals, such as tungsten, tantalum, or molybdenum may have to be used.

Figure 6E:
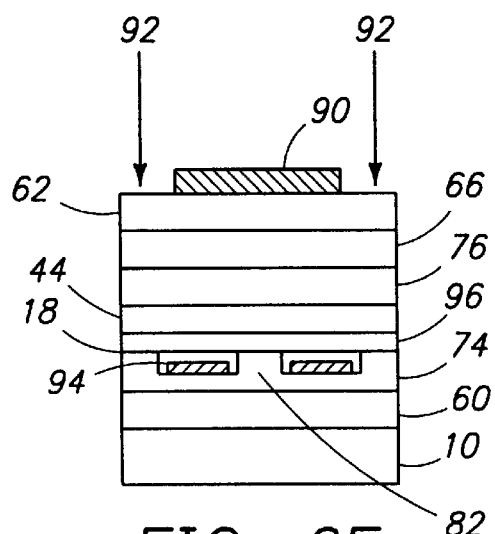

FIG. 6E shows the structure of the VCL after fusion. Wafer 10, epitaxial DBR 60, and etched cladding layer 74 with metal contacts 94 have been fused at fusion junction 18 to thinned cladding layer 96, active layer 44, second cladding layer 76, top epitaxial DBR 66, and second wafer 62. Protection layer 90 is selectively added to the areas on second wafer 62 to protect the areas above the etch mesas 82 of cladding layer 74. An etch process, which can be RIE 92 or other etch means, is then performed on the reverse side of second wafer 62 to etch the thinned cladding layer 96, active layer 44, second cladding layer 76, top epitaxial DBR 66, and second wafer 62. The RIE 92 process will be stopped at fusion junction 18, and the protection layer 90 will be removed.

Figure 6F:
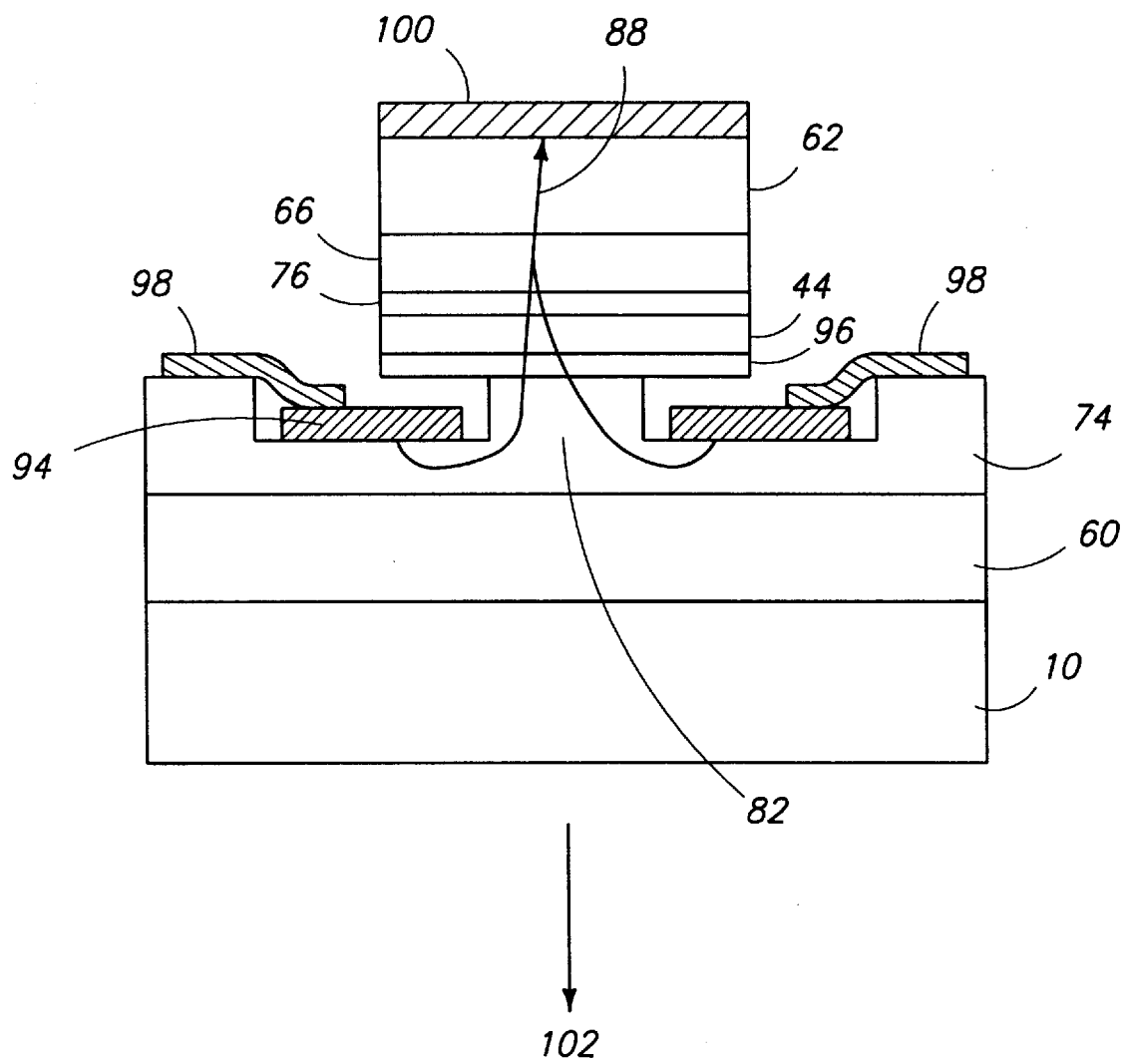

FIG. 6F shows the final structure of the VCL. After the areas of the thinned cladding layer 96, active layer 44, second cladding layer 76, top epitaxial DBR 66, and second wafer 62 are removed by RIE 92, portions of the metal contacts 94 are exposed. Additional entry contacts 98 are evaporated onto the surface of the cladding layer 74, and the entry contacts 98 overlap the metal contacts 94, allowing for greater access to the metal contacts 94 from other parts of the substrate wafer 10. The evaporation that deposits entry contacts 98 also deposits top contact 100, which provides for current flow 88 through the active region of the VCL. Since top contact 100 is normally opaque, the VCL output 102 will be through the bottom of wafer 10; however, the output 102 may pass through the top of the VCL.

Figure 7A:
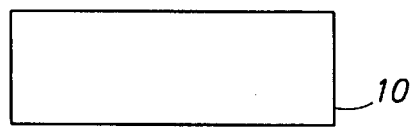
FIGS. 7A–7D are cross sectional views of a method for constructing a bipolar junction transistor.

FIGS. 7A–D show a cross sectional view of a bipolar junction transistor (BJT) fabricated using the method of the invention. FIG. 7A shows the wafer 10 prior to processing.

Figure 7B:
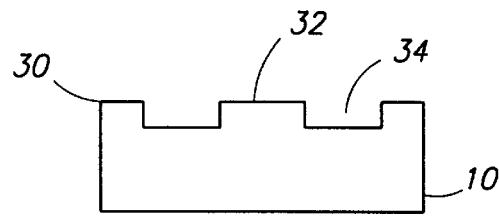

FIG. 7B shows the wafer 10 after an etching process. The etching will leave mesas 32 and valleys 34. The valleys 34 are exposed areas of the wafer 10 which are lower in height than the original top surface 30 of the wafer 10. The mesas 32 are areas which still extend to the original top surface 30 of the wafer 10.

Figure 7C:
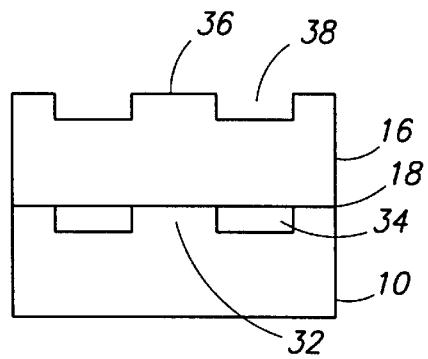

FIG. 7C shows the wafer 10 physically in contact with cover wafer 16. The cover wafer 16 can be a wafer of the same material as wafer 10, or can be of a different material than wafer 10. Cover wafer 16 has also been etched, leaving a cover mesa 36 and a cover valley 38. Once this physical connection is made, and the wafer 10 and the cover wafer 16 are properly aligned, heat is applied to the combination to fuse the wafer 10 and the cover wafer 16. The junction created by the physical connection between the wafer 10 and the cover wafer 16 is the fusion junction 18. The fusion process does not appreciably change the shape of the valley 34 or the cover valley 38 by more than a few percent. The valleys 34 now become a buried void within the structure created by the wafer 10 and the cover wafer 16. This void can be buried several microns deep in a semiconductor structure. Since there are no charge carriers in the void, any current travelling between wafer 10 and cover wafer 16 must travel through the mesas 32. The use of the valleys 34 to create cavities increases the current density in the mesas 32.

Figure 7D:
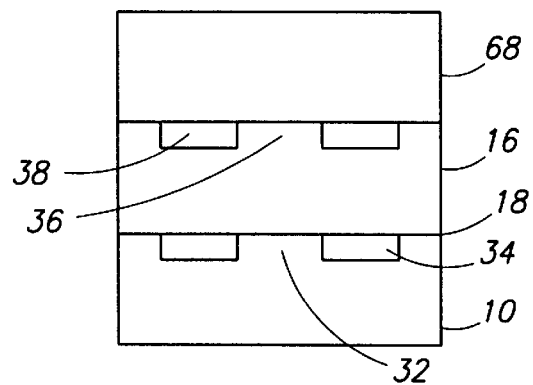

FIG. 7D shows the cover wafer 16 physically in contact with third wafer 68. The third wafer 68 can be a wafer of the same material as wafer 10 and cover wafer 16, or can be of a different material than wafer 10 or cover wafer 16. Once this physical connection is made, and the cover wafer 16 and the third wafer 68 are properly aligned, heat is applied to the combination to fuse the cover wafer 16 and the third wafer 68. The junction created by the physical connection between the wafer 10 and the cover wafer 16 is the second fusion junction 104. The fusion process does not appreciably change the shape of the valley 34 or the cover valley 38 by more than a few percent. The valleys 34 and cover valleys 38 now become buried cavities within the structure created by the wafer 10, the cover wafer 16, and the third wafer 68. These cavities can be buried several microns deep in a semiconductor structure. Since there are no charge carriers in the void, any current travelling between third wafer 68 and wafer 10 must travel through the mesas 32 and the cover mesas 36. The use of the valleys 34 and cover valleys 38 to create cavities increases the current density in the mesas 32 and cover mesas 36 and reduces the capacitance.

The structure created by wafer 10, cover wafer 16, and third wafer 68 as shown in FIG. 7D is the structure of a Bipolar Junction Transistor (BJT). For an npn BJT, wafer 10 is n-type, cover wafer 16 is p-type, and third wafer 68 is n-type. If wafer 10 is the collector, cover wafer 16 is the base, and third wafer 68 is the emitter, the device created is a BJT. Wafer 10 or third wafer 68 may be formed of a material with a different bandgap than cover wafer 34, which will create a heterojunction bipolar transistor (HBT). Current density and current flow can be altered by changing the shape of the mesas 32, cover mesas 34, valleys 34, and cover valleys 38. Further, the thickness of the wafer 10, cover wafer 16, and third wafer 68 can be altered to change the output characteristics of the BJT. Alternatively, the cover wafer 16 or third wafer 68 can be epitaxial layers grown on the wafer 10. The use of the method of the invention creates a channel in the BJT that is defined by the mesa 32 and the cover mesa 36. The geometric shaping of the channel of the BJT will create better switching characteristics in the finished device.

Figure 8A:
FIGS. 8A–8E are cross sectional views of a method for constructing a heterojunction bipolar transistor.

FIGS. 8A–8E show a cross sectional view of a heterojunction bipolar transistor (HBT) fabricated using the method of the invention. FIG. 8A shows the wafer 10 prior to processing.

Figure 8B:
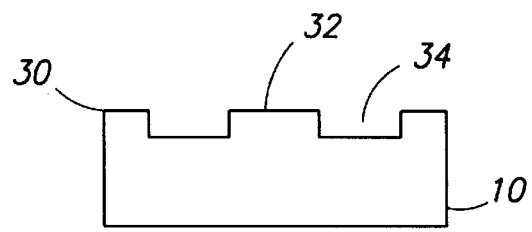

FIG. 8B shows the wafer 10 after an etching process. The etching will leave mesas 32 and valleys 34. The valleys 34 are exposed areas of the wafer 10 which are lower in height than the original top surface 30 of the wafer 10. The mesas 32 are areas which still extend to the original top surface 30 of the wafer 10.

Figure 8C:
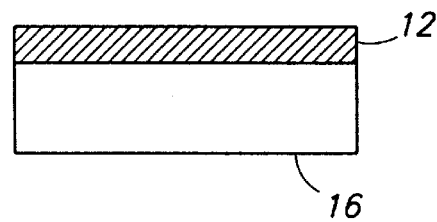

FIG. 8C shows a cover wafer 16. Cover wafer 16 is doped with dopant 12 on one surface of the cover wafer 16. The use of cover wafer 16 allows doping an n-type cover wafer 16 with a p-type dopant. It is easier to dope a n-type cover wafer 16 with a p-type dopant, and thus desirable to do so, but it is not required to do so to utilize the benefits of the invention. If cover wafer 16 is not doped with dopant 12, a diode will be created by the structure. Cover wafer 16 can be a wafer of the same material as wafer 10, or can be of a different material than wafer 10.

Figure 8D:
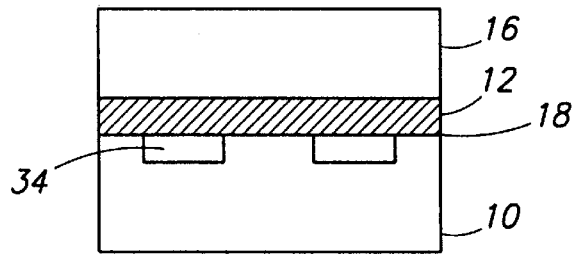

FIG. 8D shows cover wafer 16 in physical contact with wafer 10. Once this physical connection is made, and the wafer 10 and the cover wafer 16 are properly aligned, heat is applied to the combination to fuse the wafer 10 and the cover wafer 16. The junction created by the physical connection between the wafer 10 and the cover wafer 16 is the fusion junction 18. The fusion process does not appreciably change the shape of the valley 34 by more than a few percent. The valleys 34 now become a buried void within the structure created by the wafer 10 and the cover wafer 16. If the valleys 34 are filled with valley material 40, the valley material 40 will lower the capacitance between the dopant 12 and the wafer 10. This void can be buried several microns deep in a semiconductor structure. Since there are no charge carriers in the void, any current travelling between wafer 10 and cover wafer 16 must travel through the mesas 32. The use of the valleys 34 to create cavities increases the current density in the mesas 32.

Figure 8E:
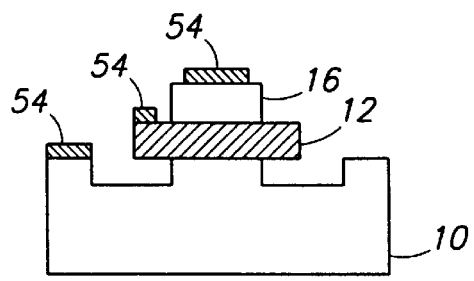

FIG. 8E shows the structure of a transistor. An etching process has been applied to cover wafer 16 to thin the cover wafer 16. A further etching process has been applied to cover wafer 16 and dopant 12 to remove the dopant from the region above at least part of the valley 34 and from the region above the ramainder of wafer 10. The etching process can be either a wet or dry etching process. Contacts 54 are attached to wafer 10, dopant 12, and cover wafer 16.

The structure of FIG. 8E is a transistor. The cover wafer 16, after being thinned, is the emitter, the dopant 12 portion of the cover wafer 16 is the base, and the wafer 10 forms the collector. The electron flow from the cover wafer 16 (emitter) to the wafer 10 (collector) must pass through the mesa 32, thereby increasing the current density in the mesa 32. Current density and current flow can be altered by changing the shape of the mesas 32 and the wells 14, as well as adding valley material 40 to the wells if desired. Further, the thickness of the wafer 10 and depth of the wells 14 can be altered to change the output characteristics of the HBT.

The importance of creating a valley 34 within the HBT is to create a lower capacitance region within the semiconductor. This lower capacitance region is critical for high speed operation, and eliminates back-biasing effects. Further, the use of valley material 40 which is conductive, such as a metal, solves resistance and thermal heating limitations which are caused by doped regions within semiconductor devices.

This invention can also be used to realize Metal Base Transistors. Present methods to bury metal layers deep within a semiconductor have not realized efficient devices because of the difficulty of burying metal layers within the semiconductor wafer.

FIGS. 9A–9F are cross sectional views of a method for constructing a photodetector. FIG. 9A shows the wafer 10 prior to processing. FIG. 9B shows the wafer 10 covered by a pattern material 28. Typically, the pattern material 28 is photoresist, but the pattern material can be anything which will alternatively expose and cover the top surface 30 of the wafer 10. The pattern material 28 is usually photoresist that has been masked and exposed to ultraviolet light.

In FIG. 9C, the pattern material 28 has been exposed to ultraviolet light, and the non-exposed areas of the pattern material 28 have been removed if the pattern material 28 is positive-reacting photoresist. Alternatively, if the pattern material 28 is negative-reacting photoresist, the exposed photoresist would be removed. the wafer 10 is then RIE etched 92. The RIE 92 creates valleys 34, mesas 32, and undercut areas 78. The undercut area 78 is important to create a gap underneath the pattern material 28.

In FIG. 9D, valley material 40 is deposited in the valleys 34. The pattern material 28 is left on the top surface 30 of the wafer 10 to shield the undercut area 78 and keep the undercut area 78 free of valley material 78. The device will still operate without the undercut area 78, but will not be as accurate as a device with an undercut area 78.

In FIG. 9E, the pattern material 28 has been removed, exposing top surface 30 of wafer 10. The height of valley material 40 must be as high as mesa 32.

In FIG. 9F, top surface 30 of wafer 10 is physically in contact with cover wafer 16. The cover wafer 16 can be a wafer of the same material as wafer 10, or can be of a different material than wafer 10. Once this physical connection is made, and the wafer 10 and the cover wafer 16 are properly aligned, heat is applied to the combination to fuse the wafer 10 and the cover wafer 16. The fusion process normally requires placing the wafers in an autoclave and raising the temperature to approximately 600 degrees Centigrade. The junction created by the physical connection between the wafer 10 and the cover wafer 16 is the fusion junction 18. The valleys 34, along with the valley material 40, now become a buried layer within the structure created by the wafer 10 and the cover wafer 16. Contacts 84 are then added to the top surface 106 of cover wafer 16.

The structure shown in FIG. 9F is then split into two structures along dicing line 108. The two resulting structures are photodetectors, with photons entering the structure from the side of the structure. Alternatively, the structure would not be split along dicing line 108, and contact 84 or valley material 40 would be deposited in a closed structure, such as a ring, square, or hexagonal structure, and the photons could enter the photodetector from the top or bottom of the structure. Current passes through contact 84 along current flow 88 to valley material 40. When photons strike the region 110 between contact 84 and valley material 40, the resistance of the material changes, allowing a different amount of current flow 88 to pass between contact 84 and valley material 40.

The discrete devices described in FIGS. 7–9 are examples of what devices can be created using the present invention. The techniques described for individual devices can also be used to fabricate integrated circuits and for large scale integration (LSI) and very large scale integration (VLSI) devices.

The techniques of the present invention may also be used in fabricating metal-oxide semiconductor field-effect transistors (MOSFETs), metal-semiconductor field-effect transistors (MESFETs), and other transistor fabrication technologies.

Figure 10:
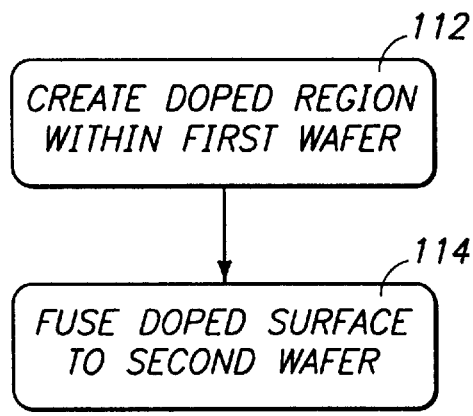
FIG. 10 shows a flowchart of the steps of the method of the invention.

FIG. 10 shows a flowchart of the steps of the method of the invention. In step 112 a doped region is created in a first wafer. Once the doped region is created, the surface with the doped region is fused to a second wafer in step 114.

Figure 11:
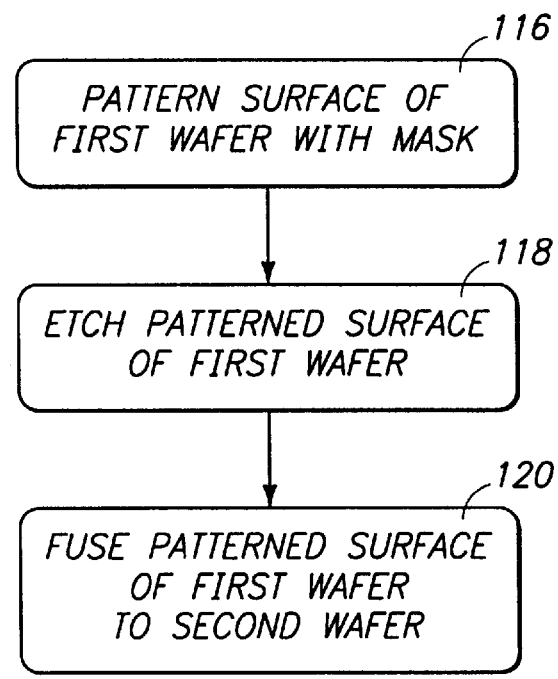
FIG. 11 shows a flowchart of the steps of an alternative embodiment of the steps of the method of the invention.

FIG. 11 shows a flowchart of the steps of an alternative embodiment of the steps of the method of the invention. In step 116, a first surface of a first wafer is patterned using resist and masking techniques. Once the pattern is created, the first surface is etched in step 118. Finally, the etched surface is fused to a second wafer in step 120.

The description of the preferred embodiments of the invention have been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the following claims.

What is claimed is:

1. A semiconductor device, comprising:
   a first semiconductor structure, wherein the first semiconductor structure comprises a first crystalline semiconductor material and a void; and
   a second semiconductor structure comprising a second crystalline semiconductor material, the void being completely surrounded by a crystalline portion of the combination of the first semiconductor structure and the second semiconductor structure.

2. The semiconductor device of claim 1, wherein the void is at least a partial vacuum.

3. The semiconductor device of claim 1, wherein the void is at least partially filled with a material.

4. The semiconductor device of claim 3, wherein the void includes an insulating material.

5. The semiconductor device of claim 3, wherein the material includes a conducting material.

6. The semiconductor device of claim 1, wherein the void is at least partially filled with a conductive material and at least partially filled with an insulating material.

7. The semiconductor device of claim 1, wherein the void is defined by a boundary, the boundary being substantially unchanged when the void has been surrounded by the semiconductor material.

8. The semiconductor device of claim 1, wherein the first semiconductor structure further comprises an amorphous material.

9. The semiconductor device of claim 1, wherein the second semiconductor structure is at least partially amorphous and at least partially crystalline.

10. A semiconductor device, comprising:
    a first semiconductor wafer having a crystalline first surface comprising a first crystalline material and a second surface, the first surface of the first wafer having at least one mesa and at least one valley; and
    a second semiconductor wafer having a crystalline bonding surface comprising a second crystalline material, the crystalline bonding surface of the second wafer coupled to the crystalline first surface of the first wafer.

* * * * *